United States Patent [19]

Aki et al.

[11] Patent Number: 5,726,756
[45] Date of Patent: Mar. 10, 1998

[54] EXPOSURE APPARATUS WITH THICKNESS AND DEFECT DETECTION

[75] Inventors: Yuichi Aki, Tokyo; Minoru Inagaki; Kanji Yokomizo, both of Kanagawa, all of Japan

[73] Assignee: Sony Corporation, Tokyo, Japan

[21] Appl. No.: 739,541

[22] Filed: Oct. 30, 1996

[30] Foreign Application Priority Data

Nov. 2, 1995 [JP] Japan ................... 7-309828

[51] Int. Cl.$^6$ ........................ G01B 11/06; G01N 21/00
[52] U.S. Cl. ................ 356/381; 356/237; 250/559.4; 250/559.27
[58] Field of Search .................. 356/381, 237, 356/239; 250/559.27, 559.28, 559.22, 548, 559.4

[56] References Cited

U.S. PATENT DOCUMENTS 4,500,615  2/1985  Iwai ........................ 356/357

*Primary Examiner*—Frank G. Font
*Assistant Examiner*—Amanda Merlino
*Attorney, Agent, or Firm*—Jay H. Maioli

[57] ABSTRACT

An optical disk master exposure apparatus employs first laser light modulated in accordance with signals to be recorded is irradiated on a resist layer to expose the resist layer in patterns corresponding to the signals to be recorded, and second laser light having a wavelength which is not sensed by the resist layer is irradiated on a predetermined surface of a predetermined member. The thickness of the resist layer is measured based on a change in output amount of the second laser light emitted by a light source, the output light amount of which is controlled so as to maintain a constant amount of second reflected light produced by irradiating the second laser light on the predetermined surface of the predetermined member. Also, the predetermined surface of the predetermined member is tested for possible defects existing thereon based on a change in amount of the second reflected light. In this way, a layer thickness test and a defect test can be conducted during an exposure stage, thereby making it possible to integrate the layer thickness testing stage, the defect testing stage, and the exposure stage into a single stage and accordingly realize an exposure apparatus which is capable of simply performing a mastering procedure at a low cost.

11 Claims, 2 Drawing Sheets

5,726,756

1

EXPOSURE APPARATUS WITH THICKNESS AND DEFECT DETECTION

BACKGROUND OF THE INVENTION

1. Field of the Invention

This invention relates to an exposure apparatus, and more particularly, to an exposure apparatus suitable for use in creating a disk master used as a mold for molding, for example, optical disks.

2. Description of the Related Art

Conventionally, a disk master (i.e., a so-called stamper) used as a mold for molding optical disks made of a plastic material is fabricated by the following procedure.

First, a photoresist is coated over one surface of a glass substrate using a spin coater or the like to form a resist layer. Subsequently, this resist layer is exposed using an optical disk master exposure apparatus to record signals thereon, and it is then developed to leave portions of the resist layer on the surface of the glass substrate which form rugged patterns in accordance with recorded signals.

Next, a conductive film layer is formed on the surface of the rugged patterns by electroless plating or the like. Further, after a metal layer is formed on the conductive film layer by electroforming, an upper portion of the metal layer is removed by grinding.

Moreover, a stamper member comprising the conductive film layer and the metal layer thus formed is peeled from the glass master and punched into a toroidal predetermined shape by a punching shear or the like.

In this way, a stamper having rugged patterns formed on one surface thereof in accordance with the recorded signals can be provided.

In the mastering procedure as described above, after a photoresist is coated over one surface of a glass substrate to form a resist layer, a test is conducted using an elipso-meter or the like to see whether or not the formed resist layer has an appropriate thickness (hereinafter, this test is referred to as the "layer thickness test"), and the glass master is tested for the presence or absence of defects thereon due to scratches, dust particles, and so on using an optical pickup or the like as fluctuations in amount of light reflected from the glass master (hereinafter, this test is referred to as the "defect test"), thus maintaining and managing a uniform quality of products.

However, since the mastering procedure requires two testing stages, i.e., the layer thickness testing stage and the defect testing stage before an exposure stage, these testing stages causes a cycle time of the whole procedure to increase. Also, since the layer thickness testing stage and the defect testing stage are separately conducted using independent test apparatuses, an installation space is required for accommodating these two apparatuses.

To solve these problems, Japanese Laid-Open Patent Application No. 5-322796 has proposed a self-contained apparatus which simultaneously conducts a layer thickness testing stage and a defect testing stage.

However, while the proposed apparatus, which simultaneously conducts a layer thickness testing stage and a defect testing stage, reduces the two testing stages to one stage as well as only requires an installation space for accommodating one apparatus, the apparatus still requires a time for one stage of conducting the layer thickness test and the defect test and an installation space for accommodating one apparatus. Thus, the problems associated with the cycle time as well as the cost and installation space of the apparatus is still left unsolved.

2

Also, an in-line type mastering system, which automatically conveys glass masters in a clean tunnel to perform a variety of stages along a single line, requires conveyer systems and frames for several stages, thus increasing the cycle time as well as the cost and installation space of the system.

SUMMARY OF THE INVENTION

In view of the foregoing, an object of this invention is to provide an exposure apparatus which is capable of simply performing the mastering procedure at a low cost.

The foregoing object and other objects of the invention have been achieved by the provision of an exposure apparatus for irradiating first laser light modulated in accordance with signals to be recorded on a resist layer formed by coating a photoresist on a predetermined surface of a predetermined member to form desired exposure patterns on the resist layer. According to the first embodiment, the exposure apparatus comprises a light source for emitting second laser light having a wavelength which is not sensed by the resist layer, an optical system for leading the second laser light emitted from the light source to the resist layer, light converging means for converging the second laser light to a predetermined surface of the predetermined member, a focusing optical system for detecting an error in relative distance between the predetermined member and the light converging means based on first reflected light or second reflected light produced by irradiating the first laser light or the second laser light on the predetermined surface of the predetermined member, driving means for controlling movements of the light converging means based on an output of the focusing optical system to maintain a constant relative distance between the predetermined member and the light converging means, a light amount control means for controlling the output amount of the second laser light emitted from the light source to maintain a constant amount of the second reflected light, first light amount detecting means for detecting the amount of the second laser light emitted from the light source, and measuring means for measuring the thickness of the resist layer based on an output of the first light amount detecting means.

Further, according to the second embodiment, an exposure apparatus for irradiating first laser light modulated in accordance with signals to be recorded on a resist layer formed by coating a photoresist on a predetermined surface of a predetermined member to form desired exposure patterns on the resist layer comprises a light source for emitting second laser light having a wavelength which is not sensed by the resist layer, an optical system for leading the second laser light emitted from the light source to the resist layer, light converging means for converging the second laser light to a predetermined surface of the predetermined member, a focusing optical system for detecting an error in relative distance between the predetermined member and the light converging means based on first reflected light or second reflected light produced by irradiating the first laser light or the second laser light on the predetermined surface of the predetermined member, driving means for controlling movements of the light converging means based on an output of the focusing optical system to maintain a constant relative distance between the predetermined member and the light converging means, a light amount control means for controlling the output amount of the second laser light emitted from the light source to maintain a constant amount of the second reflected light, a second light amount detecting means for detecting the amount of the second reflected light, and measuring means for detecting defects on the predetermined surface of the predetermined member based on an output of the second light amount detecting means.

In the first embodiment, first laser light modulated in accordance with signals to be recorded is irradiated on a resist layer to form an exposure pattern on the resist layer, and second laser light having a wavelength which is not sensed by the resist layer is irradiated with its focus placed on a predetermined surface of a predetermined member, such that the thickness of the resist layer is measured based on a change in output amount of the second laser light emitted by a light source, the output light amount of which is controlled so as to maintain a constant amount of second reflected light produced by irradiating the second laser light on the predetermined surface of the predetermined member, so that a layer thickness test can be conducted during an exposure stage, thereby making it possible to integrate the exposure stage and the layer thickness testing stage into a single stage.

In the second embodiment, first laser light modulated in accordance with signals to be recorded is irradiated on a resist layer to form an exposure pattern on the resist layer, and second laser light having a wavelength which is not sensed by the resist layer is irradiated with its focus placed on a predetermined surface of a predetermined member, such that defects on the predetermined surface of the predetermined member are detected based on a change in output amount of the second laser light emitted by a light source, the output light amount of which is controlled so as to maintain a constant amount of second reflected light produced by irradiating the second laser light on the predetermined surface of the predetermined member, so that a defect test can be conducted during an exposure stage, thereby making it possible to integrate the exposure stage and the defect testing stage into a single stage.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
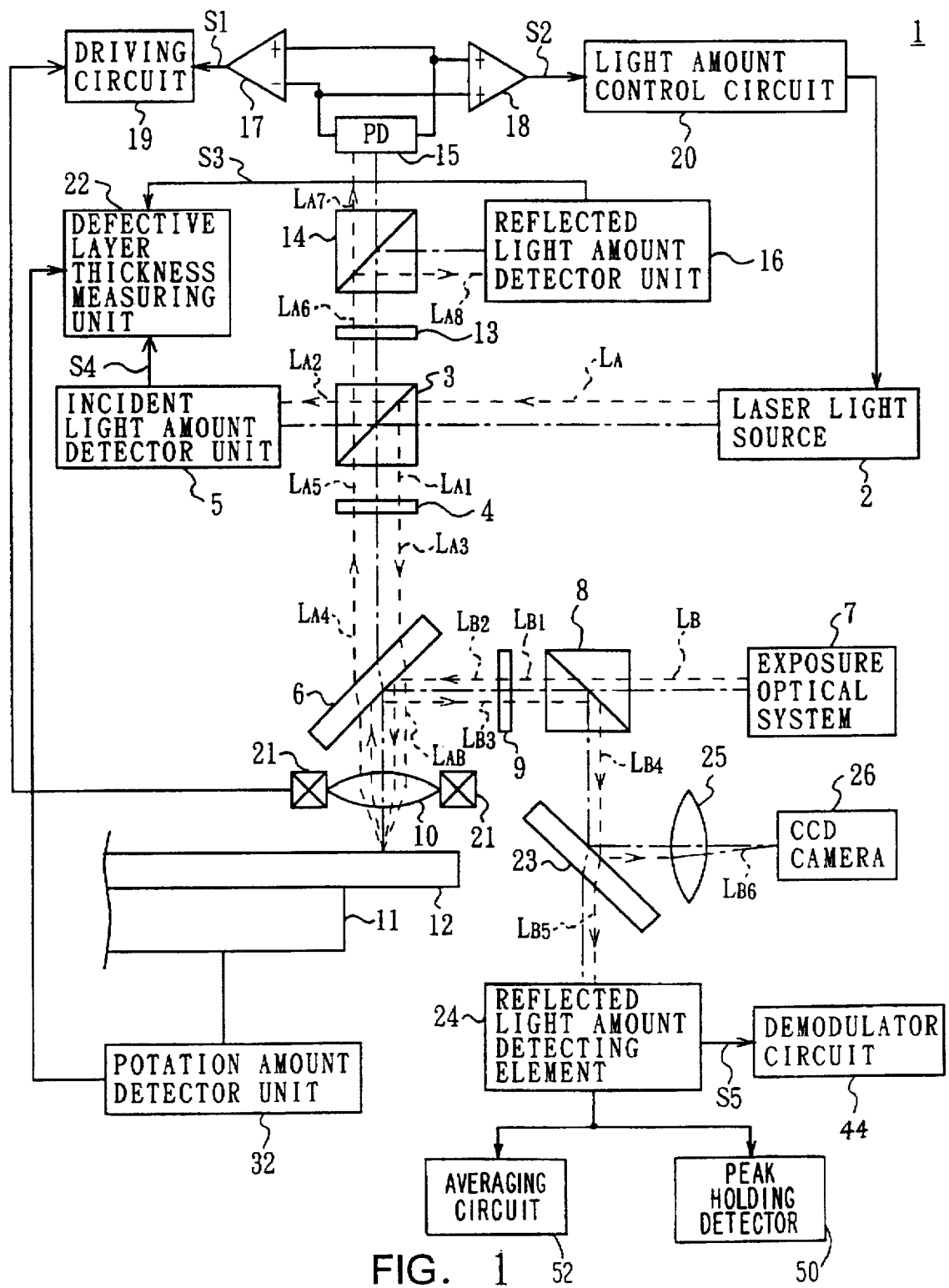
FIG. 1 is a block diagram showing the configuration of an exposure apparatus according to an embodiment of the present invention.

Preferred embodiments of this invention will be described with reference to the accompanying drawings:
(1) Whole Configuration Referring first to FIG. 1, in this embodiment, the present invention is applied to an optical disk master exposure apparatus, generally designated by reference numeral 1. Light beam $L_A$ emitted from a laser light source 2 for testing impinges on a polarizing beam splitter 3. The laser light source 2, adapted to emit single linearly polarized light, comprises a visible light semiconductor laser for emitting visible light having a wavelength which is not sensed by a resist layer. With the laser light source 2 thus constructed, the optical axis and the amount of the light beam $L_A$ can be easily adjusted.

After the testing light beam $L_A$ is incident to the polarizing beam splitter 3, its single linearly polarized component is reflected by the polarizing beam splitter 3 and is directed to and impinges on a quarter wavelength plate 4 as a light beam $L_{A1}$, while a linearly polarized component orthogonal to the single linearly polarized component transmits the polarizing beam splitter 3 and impinges on an incident light amount detector unit 5 as a light beam $L_{A2}$. The incident light amount detector unit 5 comprises a photodiode and an amplifier which forms in combination a highly accurate light amount detecting element presenting a high S/N ratio and a good linearity.

Here, the ratio of the amount of the light reflected by the polarizing beam splitter 3 and the amount of light transmitted by the same (i.e., the ratio of the amount of the light beam $L_{A1}$ to that of the light beam $L_{A2}$) is set to a value appropriate to a highly accurate detection of the light amounts. In this case, a laser head (not shown) may be rotated about the optical axis with respect to the polarized beam splitter 3 to change the light amount ratio.

The light beam $L_{A1}$ is then transformed by the quarter wavelength plate 4 into a circularly polarized beam $L_{A3}$ which in turn impinges on a dichroic mirror 6.

An exposure optical system 7 comprises a laser light source (not shown) for emitting an appropriate amount of light having a wavelength sensed by a resist layer and a modulator (not shown) for modulating signals to be recorded. Light having its intensity modulated in accordance with signals to be recorded is emitted from the exposure optical system 7 as a light beam $L_B$ for exposure and impinges on a polarizing beam splitter 8. The polarizing beam splitter 8 has its single linearly polarizing plane located such that substantially all the amount of the exposure light beam $L_B$ is transmitted by the polarizing beam splitter 8.

A single linearly polarized light beam $L_{B1}$, after transmission by the polarizing beam splitter 8, is transformed into a circularly polarized light beam $L_{B2}$ by a quarter wavelength plate 9 and impinges on the dichroic mirror 6.

The dichroic mirror 6 combines the circularly polarized light beam $L_{A3}$ and the circularly polarized light beam $L_{B2}$. A combined light beam $L_{AB}$ is converged by an objective lens 10, and irradiated on a glass master 12 placed on a turn table 11 with its focus placed on the glass master 12, so that the exposure light beam component exposes a resist layer (not shown) formed on a predetermined surface of the glass master 12.

The circularly polarized beam $L_{A3}$ impinges on the objective lens 10 with the optical axis thereof slightly offset from the optical axis of the objective lens 10.

Within the light beam $L_{AB}$ incident to the glass substrate 12, the amount of light commensurate with the reflection factor of the glass master 12 is reflected by the glass master 12 and impinges on the dichroic mirror 6 through the objective lens 10. The dichroic mirror 6 separates the light incident thereto into a circularly polarized beam $L_{A4}$ and a circularly polarized beam $L_{B3}$.

The circularly polarized light $L_{A4}$ impinges on the quarter wavelength plate 4 and is transformed into linearly polarized light $L_{A5}$ having a polarization plane orthogonal to the original single linearly polarized light $L_{A1}$. Then, the linearly polarized light $L_{A5}$ transmits the polarizing beam splitter 3 and impinges on a half wavelength plate 13, where its polarization plane is rotated to an appropriate angle such that the linearly polarized light $L_{A5}$ impinges on a polarizing beam splitter 14 as polarized light $L_{A6}$.

Since the linearly polarized light $L_{A5}$ impinges on the polarizing beam splitter 14 with its polarization plane having an angle with respect to the polarizing beam splitter 14, the linearly polarized light $L_{A5}$ is separated by the polarizing beam splitter 14 into a linearly polarized light component $L_{A7}$ which is transmitted by the polarizing beam splitter 14 and a linearly polarized light component $L_{A8}$ which is reflected by the same. The linearly polarized light $L_{A7}$ transmitting the polarizing beam splitter 14 impinges on a light beam position detector 15 for detecting a focus position error (hereinafter simply referred to as the "position detector"), while the linearly polarized light $L_{A8}$ reflected by the polarizing beam splitter 14 impinges on a reflected light amount detector unit 16.

The half wavelength plate 13 is adjusted to rotate the polarization plane of the linearly polarized light $L_{A5}$ to an appropriate angle, such that the ratio of the amount of the polarized light $L_{A7}$ to that of the polarized light $L_{A8}$ in the polarizing beam splitter 14 is set to such a value as to allow the position detector 15 and the reflected light amount detector unit 16 to highly accurately detect the linearly polarized light $L_{A7}$ and $L_{A8}$, respectively.

The position detector 15, comprising a position sensing detector which is not divided, applies a voltage corresponding to a detected amount of the polarized light $L_{A7}$ to an inverting input terminal "−" of a calculation circuit 17 and to an input terminal "+" of a calculation circuit 18.

The calculation circuit 17 calculates the difference between the applied voltage and a reference voltage "+" and generates a difference signal S1 corresponding to the difference which is sent to a driving circuit 19.

The calculation circuit 18 sums the applied voltage and the reference voltage "+" and sends a sum signal S2, as the summation result, to a light amount control circuit 20.

The driving circuit 19 drives the objective lens 10 through a focus actuator 21 based on the difference signal S1 and controls the objective lens 10 such that the glass master 12 is irradiated with the light beam $L_{AB}$ with its focus placed thereon (i.e., such that the difference signal S1 becomes "0").

The light amount control circuit 20 controls the output amount of the laser light $L_A$ emitted from the laser light source 2 based on the sum signal S2, such that the sum signal S2 remains constant within its limited frequency response irrespective of the reflection factor on the glass master 12 (i.e., so as to maintain a constant amount of reflected light from the glass master 12). With the control of the light amount control circuit 20, a constant focus gain can be always provided even if the reflection factor of the glass master 12 fluctuates due to a varying thickness of the resist layer, thus making it possible to highly accurately and highly stably control the focus position.

The reflected light detector unit 16, which comprises a high frequency response light amount detecting element having a high S/N ratio and a good linearity, detects the amount of the linearly polarized light $L_{AB}$ and transduces the light amount to a voltage which is sent to a defective layer thickness measuring unit 22 as a detection signal S3. Here, when a converged beam spot or the linearly polarized light $L_{A8}$ is irradiated on scratches, dust particles, and so on possibly present on the glass master 12, the reflected light amount detected by the reflected light amount detector unit 16 decreases depending upon their size and shape.

More specifically, if dust particles and/or scratches exist on the glass substrate 12, a light amount detected by the reflected light amount detector unit 16 exhibits an abrupt change, and the defective layer thickness measuring unit 22 measures the length of a range in which the abrupt change appears as the width of drop-out (DO).

The incident light amount detector unit 5 detects the amount of a light beam $L_{A2}$ transmitted by the beam splitter 3 and transduces this light amount to a voltage which is sent to the defective layer thickness measuring unit 22 as a detection signal S4.

The intensity of light reflected by the glass master 12 changes as the thickness of the resist layer varies, due to multiple interference reflection of the thin film constituting the resist layer. Since the output light amount of the laser light source 2 is controlled to maintain a constant amount of light reflected from the glass master 12 as mentioned above, a change in the reflection factor due to a varying layer thickness of the resist layer (i.e., a change in the amount of the reflected light) can be detected as a change in the output light amount of the laser light source 2. Thus, the defective layer thickness measuring unit 22 is adapted to measure a layer thickness based on a change in the output light amount of the laser light source 2.

The circularly polarized light $L_{B3}$ reflected by the dichroic mirror 6 is transformed into a single linearly polarized beam $L_{B4}$ having a polarization plane orthogonal to the original single linearly polarized light beam $L_{B1}$ by the quarter wavelength plate 9. Then, substantially the entire amount of the single linearly polarized light beam $L_{B4}$ is reflected by the polarizing beam splitter 8 and impinges on a half mirror type beam splitter 23 which separates the light beam $L_{B4}$ into light $L_{B5}$ incident on the reflected light amount detecting element 24 and light $L_{B6}$ which is converged by an objective lens 25 and impinges on a charge coupled device (CCD) camera 26.

As for the ratio of the amount of the light reflected by the half mirror type beam splitter 23 and the amount of light transmitted by the same (i.e., the ratio of the amount of the light beam $L_{B5}$ to that of the light beam $L_{B6}$), since the CCD camera 26 is sensitive to an extremely small amount of light, even if the light amount ratio is approximately 100:1 or less, the CCD camera 26 is provided with a sufficient amount of light. Thus, a focusing state of an exposure beam spot on the glass substrate 12 can be remotely observed through an output signal from the CCD camera 26.

The reflected light amount detecting element 24 transduces the incident light $L_{B5}$ to an electric signal S5 corresponding to the amount of the incident light $L_{B5}$. The electric signal S5 is then sent to a demodulator circuit 44 and demodulated by the same.

(2) Configuration of Defective Layer Thickness Measuring Unit

Figure 2:
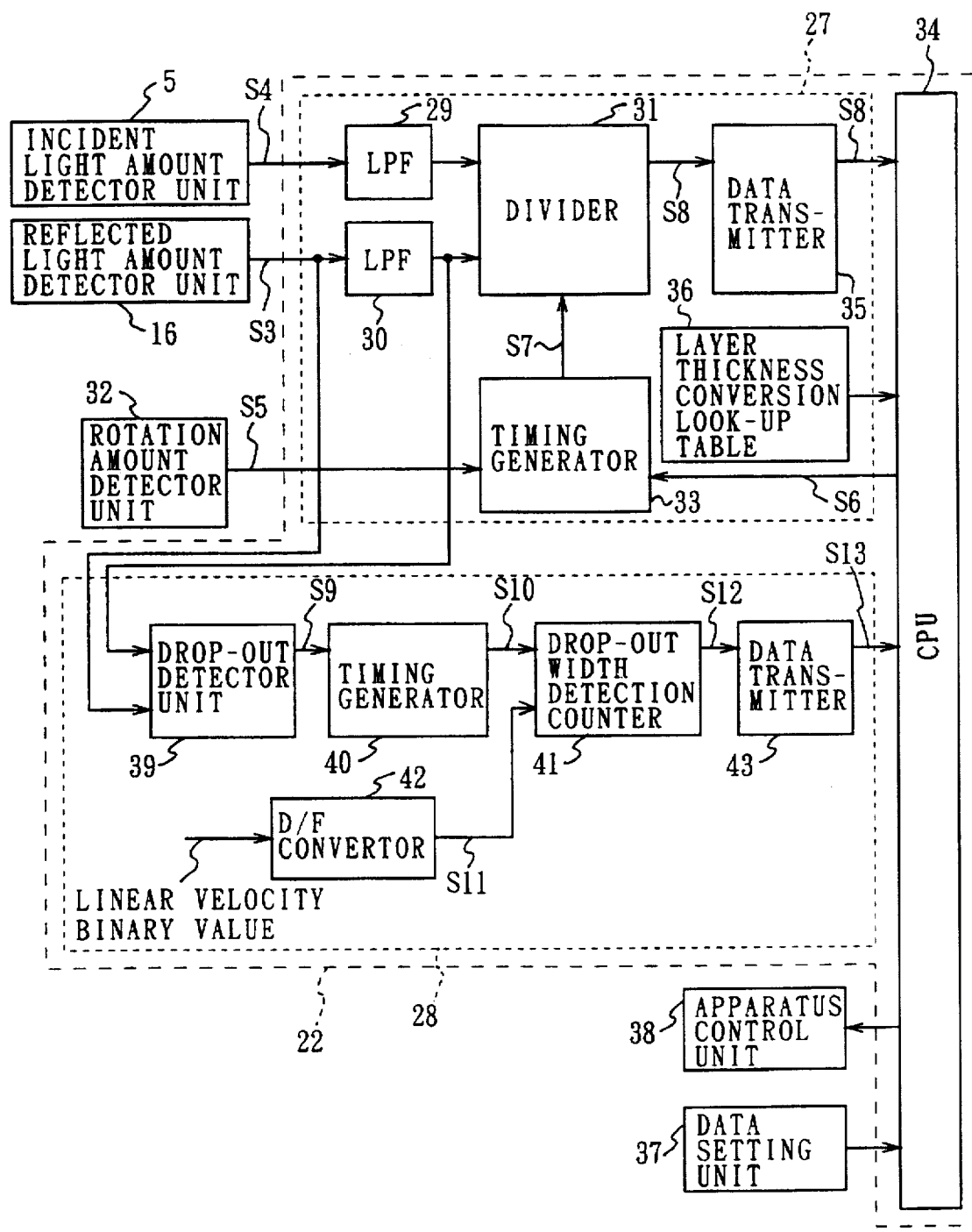
FIG. 2 is a block diagram showing the configuration of a defective layer thickness measuring unit.

Referring next to FIG. 2, where parts corresponding to those in FIG. 1 are designated by the same reference numerals, a defective layer thickness measuring unit of the present embodiment, generally designated by reference numeral 22, comprises a layer thickness measuring section 27 and a defect measuring section 28.

In the thickness measuring section 27, a detection signal S4 sent from the incident light amount detector unit 5 is inputted to a low pass filter (LPF) 29, while a detection signal S3 sent from the reflected light amount detector unit 16 is inputted to a low pass filter (LPF) 30. The LPFs 29, 30 attenuate frequency components, for example, higher than 10 Hz in the associated detection signals S3, S4 to remove high frequency components which have been possibly generated by dust particles and scratches on a glass master 12 and are not required for the measurement of layer thickness. The detection signals S3, S4 passing through the LPFs 29, 30 are sent to a divider 31.

A rotation amount detector unit 32 comprises an encoder, a detecting element, and a detector circuit, and generates a pulse train signal S5 corresponding to the rotational speed of the turn table 11 fed to a timing generator 33. For example, with an encoder having a resolution of 2,000, the rotation amount detector unit 32 outputs 2,000 pulses as an A-phase output and one pulse as a Z-phase output per rotation of the turn table 11.

The timing generator 33, which comprises a counter and a logic circuit, generates a timing pulse signal S7 for measuring a layer thickness to the divider 31 based on the pulse train signal S5 sent from the rotation amount detector unit 32 (A-phase and Z-phase pulse trains) and a signal S6 indicative of a number of encoder pulses sent from a CPU 34 for setting a measuring angle. For example, when a measurement is made at intervals of 1.6 μm on the radius of the resist layer and at every 45°, the timing generator 33 is supplied with the signal S6 indicative of 250 (D) from the CPU 34, and generates the timing pulse signal S7 at the time it counts the 250th pulse of the A-phase signal after 1,000 pulses of the Z-phase signal have been counted (when a thread is moved by 1.6 μm per rotation of the turn table).

The divider 31 divides the output voltage of the LPF 30 by the output voltage of the LPF 29 in an analog domain based on the timing pulse signal S7 (i.e., amount of reflected light/amount of incident light) and converts the division result to a digital form which is utilized to generate binary data S8 for referencing a layer thickness conversion look-up table 36 having layer thickness data corresponding to an output of a data transmitter 35. The binary data S8 is sent to the data transmitter 35.

The data transmitter 35 may comprise a buffer for temporarily storing the binary data S8 sent from the divider 31 and for sending the binary data S8 to the CPU 34 in synchronism therewith.

A data setting unit 37, which comprises a switch and a logic circuit, sets a layer thickness median value, a layer thickness variation tolerable value, a layer thickness error frequency, a drop-out width, and a drop-out error frequency, and transfers the set parameters to the CPU 34.

The CPU 34 retrieves a layer thickness value corresponding to the data S8 sent from the data transmitter 35 from the layer thickness conversion look-up table 36, and compares the retrieved layer thickness value with the layer thickness median value, the layer thickness variation tolerable value, and the layer thickness error frequency set by the data setting unit 37. The comparison results are sent to an apparatus control unit 38 through the CPU 34. The apparatus control unit 38 performs controls based on the comparison results, e.g., for stopping the operation of the apparatus, and so on.

The layer thickness conversion look-up table 36 is implemented by a read only memory (ROM) and stores a plurality of data associated with the relationship between the amount of reflected light and the thickness of a resist layer on a predetermined glass master previously measured by an elipso-meter or the like.

Thus, the CPU 34 is allowed to retrieve a layer thickness value (layer thickness data) corresponding to data S8 sent from the data transmitter 35, based on this data S8, from the layer thickness conversion look-up table 36.

It should be noted that the layer thickness data, retrieved by the CPU 34 from the layer thickness conversion look-up table 36, can be sufficiently provided when the amount of reflected light is measured at intervals of several millimeters of the radius of a glass master with a certain angle component, in view of the characteristic of the resist layer. In the present embodiment, therefore, the measurements are made at intervals of 1.6 μm and at every 45°.

In the defect measuring section 28, a drop-out detector 39 comprising a window comparator compares an input voltage to the LPF 30 with an output voltage from the LPF 30, ±10% as a reference value, and generates a drop-out detection signal S9 corresponding to the comparison result to a timing generator 40.

Specifically, an input signal applied to the LPF 30 has a light amount component in a high frequency region when dust particles and/or scratches exist on the glass master 12. An output signal from the LPF 30, in turn, is free from such high frequency components. The drop-out detector 39 compares these two signals to output the drop-out detection signal S9.

The timing generator 40, which comprises a logic circuit, utilizes edges of the drop-out detection signal S9 to supply a drop-out width detecting counter 41 with a count enable signal S10 as a timing signal.

A digital/frequency (D/F) converter 42, which comprises a quartz oscillator and a full adder, supplies the drop-out width detecting counter 41 with a pulse train signal S11 formed of carries generated when linear velocity binary values, inputted thereto, are fully added. The frequency of the pulse train signal S11 corresponds to a linear velocity. Also, the linear velocity binary value is data which changes in response to a change in the linear velocity, and can be generated based on the output of the rotation amount detector unit 32 and an output of a feeding mechanism (not shown).

One pulse generated in the D/F converter 42 is regarded as a minimal resolution for detecting a drop-out width. For example, assuming that a clock supplied to the 16-bit full adder is at a frequency of 16 MHz and a binary value inputted to the D/F converter 42 is "7FFF" (indicative of a linear velocity of 8 m/S), a signal at a frequency of 8 MHz is outputted from the D/F converter 42, and the minimal resolution is determined to be 1 μm. Since this signal has jitter of one clock portion, the clock frequency is preferably as high as possible within a logical operation range.

The drop-out width detecting counter 41, which comprises a counter circuit, counts pulses in the pulse train signal S11 based on the count enable signal S10, and supplies a binary value S12 to a data transmitter 43. Specifically, the drop-out width detecting counter 41 counts the pulse indicative of the minimal resolution during the occurrence of drop-out, and generates a binary value S12 corresponding to a detected drop-out width to the data transmitter 43.

Thus, a binary value indicative of a linear velocity is converted to a frequency corresponding to the linear velocity to generate the minimal resolution pulse, and a train of the minimal resolution pulses is counted while the light amount is changing. In this way, a drop-out width can be detected.

The data transmitter 43, which comprises a logic circuit, compares a drop-out width in the form of the binary value S12 with a reference drop-out width transferred from the data setting unit 37 through the CPU 34, and supplies the CPU 34 with a signal S13 indicative of the presence of drop-out each time the drop-out width or the binary value S12 exceeds the reference drop-out width.

The CPU 34 counts the signal S13 indicative of the presence of drop-out sent from the data transmitter 43, and compares the counted value with the drop-out error tolerable frequency set by the data setting unit 37. When the counted value exceeds the drop-out error tolerable frequency, the CPU 34 supplies the apparatus control unit 38 with a signal representing the comparison result.

The apparatus control unit 38 is adapted to interrupt the control for the apparatus, and so on, based on the signal sent from the CPU 34.

(3) Operation and Effects of Embodiment

In the optical disk master exposure apparatus 1 configured as described above, the laser light $L_B$ for exposure, modulated in accordance with signals to be recorded, is irradiated on a resist layer to expose the resist layer for forming patterns in accordance with the signals to be recorded on the resist layer. Also, laser light $L_A$ for a defective layer thickness test, having a wavelength which is not sensed by the resist layer, is irradiated on the glass master 12 with its focus placed on the glass master 12. An output light amount of the laser light source 2 is controlled to maintain a constant amount of reflected light from the glass master 12 (indicated by the sum signal S2). Then, the amount of laser light $L_{A2}$ emitted from the thus controlled laser light source 2 and the amount of reflected light from the glass master 12 are detected by the incident light amount detector unit 5 and the reflected light amount detector unit 16, respectively, which generate the detection signals S3, S4 to the defective layer thickness measuring unit 22.

The defective layer thickness measuring unit 22 measures the thickness of the resist layer in the layer thickness measuring section 27 based on the detection signals S4, S3 from the incident light amount detector unit 5 and the reflected light amount detector unit 16, respectively, and detects defects on the glass master 12 in the defect measuring section 28 based on the detection signal S3 from the reflected light amount detector unit 16.

In this way, the optical disk master exposure apparatus 1 can conduct a layer thickness test for a resist layer and a defect detecting test for a glass master during an exposure stage, so that the exposure stage, the layer thickness testing stage, and the defect testing stage can be integrated into a single stage, thus making it possible to significantly reduce the cycle time of the mastering procedure.

Also, since the optical disk master exposure apparatus 1 does not require separate apparatuses for the layer thickness test and for the defect test, it is possible to largely reduce the cost and installation space for apparatuses which would otherwise be required for the layer thickness test and the defect test.

Further, since the optical disk master exposure apparatus 1 can detect troubles while modulated signals are being recorded, it is possible to accurately detect in which area of the recorded signal and to which degree such troubles have affected as well as to estimate to which degree the troubles would affect the recorded signals when they are reproduced.

Moreover, in the optical disk master exposure apparatus 1, since the output light amount of the laser light $L_A$ emitted from the laser light source 2 is controlled to be constant such that the sum signal S2 generated by the position detector 15 remains constant irrespective of the reflection factor of a resist layer within its limited frequency response range, a change in the reflection factor of the resist layer can be measured without modifying the focus gain, thereby making it possible to measure the thickness of the resist layer during an exposure stage while ensuring a stable focusing operation.

Also, since the optical disk master exposure apparatus 1 employs a high-frequency response light amount detecting element for the reflected light amount detector unit 16, a stable focusing operation is provided. In addition, very small defects can even be detected during the exposure stage without any limitation imposed by the frequency response of the sum signal S2 generated by the position detector 15.

According to the configuration described above, the laser light $L_B$ for exposure, modulated in accordance with signals to be recorded and emitted from the exposure optical system 7 is irradiated on a resist layer to form an exposure pattern on the resist layer. Meanwhile, the laser light $L_A$ for a defective layer thickness test, which is not sensed by the resist layer, is irradiated on a glass master 12. The layer thickness of the resist layer is measured based on a change in the amount of the laser light $L_A$ emitted from the laser light source 2, the output light amount of which is controlled such that the amount of the testing laser light $L_A$ reflected from the glass master 12 remains constant. Defects on the glass master 12 are detected based on changes in the amount of the reflected light $L_{A8}$ produced by irradiating the testing laser light $L_A$ on the glass master 12. Since the layer thickness test for the resist layer and the defect test for the glass master 12 can be conducted during an exposure stage, the exposure stage, the layer thickness testing stage, and the defect testing stage can be integrated into a signal stage, thereby making it possible to realize an optical disk master exposure apparatus which can simply perform a mastering procedure at a low cost.

(4) Other Embodiments

While the foregoing embodiment has been described for the case where the light beam $L_{A2}$ transmitting the polarizing beam splitter 3 is directed to the light amount detector unit 5, and the light beam $L_{A1}$ reflected by the polarizing beam splitter 3 is directed to the quarter wavelength plate 4, the present invention is not limited to this particular configuration. Alternatively, the light beam $L_{A2}$ transmitting the polarizing beam splitter 3 can be directed to the quarter wavelength plate 4, while the light beam $L_{A1}$ reflected by the polarizing beam splitter 3 be directed to the light amount detector unit 5.

Also, while the foregoing embodiment has been described for the case where a non-divided photo-detector is employed as the position detector 15, the present invention is not limited to this particular form of position detector, and a bisected photo-detector or the like can be employed alternatively.

Further, while the foregoing embodiment has been described for the case where defects on the glass master 12 are measured based on the amount of the linearly polarized light $L_{A8}$ detected by the reflected light amount detector unit 16, the present invention is not limited to this measuring scheme. Alternatively, such defects on the glass master 12 can be measured based on the sum signal S2 outputted from the calculation circuit 18.

In this case, the position detector 15 is generally selected to have a limited frequency response lower than that of the reflected light amount detector unit 16 so as not to oversensitively react to dust particles and scratches on the glass master 12, thus preventing an unstable automatic focusing control. It is therefore preferable that the reflected light amount detector unit 16 comprising a reflected light amount detecting element with high frequency response be operated independently of the position detector 15 in order to stably detect smaller defects.

Further, in the foregoing embodiment, the linearly polarized light $L_{A1}$ transmitted by the polarizing beam splitter 14 is directed to the position detector 15, while the linearly polarized light $L_{A8}$ reflected by the polarizing beam splitter 14 is directed to the reflected light amount detector unit 16. The present invention, however, is not limited to this particular configuration. Alternatively, the linearly polarized light $L_{A7}$ transmitted by the polarizing beam splitter 14 can be directed to the reflected light amount detector unit 16, while the linearly polarized light $L_{A8}$ reflected by the polarizing beam splitter 14 may be directed to the position detector 15.

Further, while the foregoing embodiment has been described for the case where the amount of light emitted from the laser light source 2 is detected by the light amount detector unit 5, the present invention is not limited to the use of the light amount detector unit 5 but can employ a laser light source having a built-in light amount detecting element such that the amount of light emitted from the laser light source 2 is detected by the light amount detecting element built in the laser light source 2.

Further, in the foregoing embodiment, the light beam $L_B$ emitted from the exposure optical system 7 is transmitted by the polarizing beam splitter 8 and is irradiated on a resist layer, and the circularly polarized light $L_{B3}$ from the glass master 12 is reflected by the polarizing beam splitter 8 to impinge on the dichroic mirror 12. The present invention, however, is not limited to this particular configuration, and alternatively, the position of the exposure optical system 7 relative to the polarizing beam splitter 8 can be replaced with that of the beam splitter 23, the objective lens 25, the CCD 26, the reflected light amount detector element 24, and the demodulator circuit 25. In this case, the polarization direction of the light begun $L_B$ from the exposure optical system 7 is rotated by 90° so that the light beam $L_{B3}$ is reflected by the polarizing beam splitter 8 and is irradiated on the resist layer. The circularly polarized light $L_{B3}$ from the glass master 12, in turn, transmits the polarizing beam splitter 8.

Further, while the foregoing embodiment has been described for the case where defects on the glass master 12 are measured based on the output of the reflected light amount detector unit 16, the present invention is not limited to this measuring scheme. Alternatively, a demodulated signal provided by the demodulator circuit 44 can be compared with a corresponding modulated signal to detect such defects on the glass master 12.

In this case, since the reflected light amount detecting element 24 is capable of receiving substantially all the amount of the circularly polarized light $L_{B3}$ reflected by the dichroic mirror 6 to ensure a sufficient S/N ratio, a demodulated signal provided by the demodulator circuit 25 can be compared with a corresponding modulated signal to detect defects on the glass master 12. It is also possible to remotely observe a focusing state of an exposure beam spot while comparing a demodulated signal with a corresponding modulated signal to detect defects on the glass master 12.

Further, while the foregoing embodiment has been described for the case where the thickness of a resist layer is measured in the defective layer thickness measuring unit 22 based on the output of the incident light amount detector unit 5, the present invention is not limited to this measuring scheme. Alternatively, a peak-holding detector circuit 50 may be provided for detecting and holding a peak of an output signal from the reflected light amount detecting element 24, such that the thickness of a resist layer can be measured based on an output of the peak-holding detector circuit 52. Further alternatively, an averaging circuit can be provided for averaging output signals of the reflected light amount detecting element 24 to detect the reflection factor of a resist layer, and the layer thickness of the resist layer is measured based on an output of the averaging circuit 52. In this event, if the final layer thickness value of the resist layer is determined together with measurement results provided by the defective layer thickness measuring unit 22 based on the output of the reflected light amount detector unit 16, the thickness of the resist layer can be measured with a higher accuracy.

Further, while the foregoing embodiment has been described for the case where the laser light $L_A$ emitted from the laser light source 2 is irradiated on the glass master 12 to produce reflected light (the linearly polarized light $L_{A7}$) which is relied on to detect an error in the relative distance between the disk master 12 and the objective lens 10, the present invention is not limited to this particular configuration. Alternatively, such an error in the relative distance between the disk master 12 and the objective lens 10 can be detected based on reflected light (the linearly polarized light $L_{A8}$) produced by irradiating the laser light $L_B$ emitted from the exposure optical system 7 on the resist layer.

Further, while the foregoing embodiment has been described for the case where the layer thickness conversion look-up table 36 is used to store data indicative of the relationship between the amount of reflected light and the layer thickness, the present invention is not limited to the use of such a look-up table, but can calculate a layer thickness based on measurements of the wavelength of laser light, an optical path, the reflection factor of a resist, and so on.

In addition, although the layer thickness conversion look-up table 36 is separately provided in the foregoing embodiment, the present invention can be modified to utilize the CPU 34 to calculate a layer thickness, instead of the layer thickness conversion look-up table 36, if the relationship between the amount of reflected light and the layer thickness can be approximated by a simple equation.

Further, the foregoing embodiment has been described in connection with the optical disk master exposure apparatus 1 in which the incident light amount detector unit 5 detects the output amount of laser light emitted from the laser light source 2 to measure the layer thickness of a resist layer, and the reflected light amount detector unit 16 detects the amount of reflected light produced by irradiating the laser light emitted from the laser light source 2 on the glass master 12, with its focus placed on the glass master 12. The present invention, however, is not limited to the exposure apparatus described above. Alternatively, the exposure apparatus according to the present invention can conduct either a test for the thickness of the resist layer or a test for defects on the glass master 12. Also, the reflected light amount detecting element 24 and the demodulator circuit 25 can be removed from the exposure apparatus.

Further, while the foregoing embodiment has been described for the case where laser light emitted from the laser light source 2 and laser light emitted from the exposure optical system 7, combined by the dichroic mirror 6, are converged by the objective lens 10 and then irradiated on the glass master 12, the present invention is not limited to this particular optical system. Alternatively, the laser light emitted from the laser light source 2 and the laser light emitted from the exposure optical system 7 can be separately irradiated on the glass master 12, instead of combining them.

Further, while the foregoing embodiment has been described for the case where a light source for emitting second laser light having a wavelength which is not sensed by a resist layer is employed as the laser light source 2, the present invention is not limited to this particular light source. Alternatively, a variety of other light sources, for example, a He—Ne (Helium-Neon) laser and so on, can be utilized as the light source 2. When a He—Ne laser is utilized as the light source 2, its output light amount is adjusted by an external modulator such as an audio optical modulator (AOM), an electro-optical modulator (EOM), or the like and a light amount adjusted.

Further, while the foregoing embodiment has been described for the case where the optical system for leading the second laser light emitted from the light source 2 to a resist layer is composed of the polarizing beam splitter 3, the quarter wavelength plate 4, the dichroic mirror 6, and the objective lens 10, the present invention is not limited to this particular optical system but can utilize a variety of other optical systems as the optical system for leading the second laser light to the resist layer.

Further, while the foregoing embodiment has been described for the case where the objective lens 10 is employed as a light converging means for converging the second laser light to a predetermined surface of a predetermined member, the present invention is not limited to the employment of an objective lens for this purpose. As the light converging means for converging the second laser light on a predetermined surface of a predetermined member, a variety of other light converging means can be applied.

In addition, in the foregoing embodiment, a focusing optical system for detecting an error in the relative distance between a predetermined member and the light converging means based on first reflected light and second reflected light respectively produced by irradiating first laser light and second laser light on a predetermined surface of the predetermined member is implemented by the laser light source 2, the polarizing beam splitter 3, the quarter wavelength plate 4, the dichroic mirror 6, the objective lens 10, the half wavelength plate 13, the polarizing beam splitter 14, and the optical beam position detector 15. The present invention, however, is not limited to this particular configuration, but can employ a variety of other focusing optical means as the focusing optical means for the error detection.

Further, while the foregoing embodiment has been described for the case where the driving means for controlling the movement of the light converging means based on the output of the focusing optical means to maintain a constant relative distance between a predetermined member and the light converging means is implemented by the calculation circuit 17, the driving circuit 19, and the actuator 21, the present invention is not limited to the use of these particular components for the driving means, but can employ a variety of other control means as the driving means.

Further, while the foregoing embodiment has been described for the case where the light amount control means for controlling the output amount of second laser light emitted from a light source so as to maintain a constant amount of second reflected light is implemented by the optical beam position detector 15, the calculation circuit 18, and the light amount control circuit 20, the present invention is not limited to the use of these particular components, but can employ a variety of other light amount control means.

Also, while the foregoing embodiment has been described for the case where the incident light amount detector means 5 is employed as a first light amount detecting means for detecting the amount of second laser light emitted from a light source, the present invention is not limited to this particular type of light amount detecting means, but can employ a variety of other light amount detecting means as the first light amount detecting means.

In addition, while the foregoing embodiment has been described for the case where the reflected light amount detector unit 16 is employed as a second light amount detecting means for detecting the amount of second reflected light, the present invention is not limited to this particular type of light amount detecting means but can employ a variety of other light amount detecting means as the second light amount detecting means.

Further, while the foregoing embodiment has been described for the case where the defective layer thickness measuring unit 22 is employed as a measuring means for measuring the thickness of a resist layer or for detecting defects on a predetermined surface of a predetermined member based on an output of the first and/or second light amount detecting means, the present invention is not limited to this particular measuring means but may employ a variety of other measuring means as the required measuring means.

Further, while the foregoing embodiment has been described for the case where the reflected light amount detecting means 24 is employed as a third light amount detecting means for detecting the amount of first reflected light, the present invention is not limited to this particular light amount element, but can employ a variety of other light amount detecting means as the third light amount detecting means.

Further, while the foregoing embodiment has been described for the case where the demodulator circuit 25 is employed as a demodulating means for demodulating recorded signals based on an output of the third light amount detecting means, the present invention is not limited to this demodulator circuit, but can employ a variety of other demodulating means as the required demodulating means.

Further, while the foregoing embodiment has been described for the case where the present invention is applied to a test for measuring the thickness of a resist layer formed by coating a photoresist on a predetermined surface of a disk master used as a mold when an optical disk is molded and a test for detecting defects on the glass master, the present invention is not limited to these tests, but can be applied to an exposure apparatus used to form a desired circuit pattern on a resist layer formed by coating a photoresist on a predetermined surface of a wafer, and so on. More generally, the present invention can be applied to any exposure apparatus for forming a desired exposure pattern on a resist layer by irradiating first laser light, modulated in accordance with signals to be recorded, on the resist layer which is formed by coating a photoresist on a predetermined surface of a predetermined member.

According to the present invention as described above, first laser light modulated in accordance with signals to be recorded is irradiated on a resist layer to form an exposure pattern on the resist layer, and second laser light having a wavelength which is not sensed by the resist layer is irradiated with its focus placed on a predetermined surface of a predetermined member, such that the thickness of the resist layer is measured based on a change in output amount of the second laser light emitted by a light source, the output light amount of which is controlled so as to maintain a constant amount of second reflected light produced by irradiating the second laser light on the predetermined surface of the predetermined member, so that a layer thickness test for the resist layer can be conducted during an exposure stage, thereby making it possible to integrate the exposure stage and the layer thickness testing stage into a single stage and accordingly realize an exposure apparatus which is capable of simply performing a mastering procedure at a low cost.

Also, according to the present invention, first laser light modulated in accordance with signals to be recorded is irradiated on a resist layer to form an exposure pattern on the resist layer, and second laser light having a wavelength which is not sensed by the resist layer is irradiated with its focus placed on a predetermined surface of a predetermined member, such that defects on the predetermined surface of the predetermined member are detected based on a change in output amount of the second laser light emitted by a light source, the output light amount of which is controlled so as to maintain a constant amount of second reflected light produced by irradiating the second laser light on the predetermined surface of the predetermined member, so that a defect test for the predetermined member can be conducted during an exposure stage, thereby making it possible to integrate the exposure stage and the defect testing stage into a single stage and accordingly realize an exposure apparatus which is capable of simply performing a mastering procedure at a low cost.

While there has been described in connection with the preferred embodiments of the invention, it will be obvious to those skilled in the art that various changes and modifications may be made and it is the aim, therefore, to cover in the appended claims all such changes and modifications as fall within the true spirit and scope of the invention.

What is claimed is:

1. An exposure apparatus for irradiating first laser light modulated in accordance with signals to be recorded on a resist layer formed by coating a photoresist on a predetermined surface of a predetermined member to form desired exposure patterns on said resist layer said apparatus comprising:
   a light source for emitting second laser light having a wavelength that will not expose said resist layer;
   an optical system for directing said second laser light emitted from said light source to said resist layer;
   light converging means for converging said second laser light to a predetermined surface of said predetermined member;
   a focusing detection system for detecting an error in relative distance between said predetermined member and said light converging means based on a reflected light produced by irradiating said second laser light on the predetermined surface of said predetermined member;
   driving means for controlling movements of said light converging means based on an output of said focusing detection system to maintain a constant relative distance between said predetermined member and said light converging means;
   a light amount control means for controlling an amount of said second laser light emitted from said light source to maintain a constant amount of said reflected light;
   light amount detecting means for detecting the amount of said second laser light emitted from said light source; and
   measuring means for measuring a thickness of said resist layer based on an output of said first light amount detecting means.

2. The exposure apparatus according to claim 1, further comprising
   second light amount detecting means for detecting an amount of said reflected light, wherein said measuring means includes means for detecting defects on the predetermined surface of said predetermined member based on an output of said second light amount detecting means.

3. The exposure apparatus according to claim 2, further comprising:
   third light amount detecting means for detecting an amount of a second reflected light produced by irradiating said first laser light on the predetermined, surface of said predetermined member; and
   demodulating means for demodulating an output signal from said third light amount detecting means,
   wherein said measuring means includes means for detecting defects on the predetermined surface of said predetermined member based on an output of said demodulating means.

4. The exposure apparatus according to claim 2, further comprising:
   third light amount detecting means for detecting an amount of a second reflected light produced by irradiating said first laser light on the predetermined surface of said predetermined member; and
   peak-holding detecting means for detecting and holding a peak of an output signal from said third light amount detecting means,
   wherein said measuring means measures the thickness of said resist layer based on an output of said peak-holding detecting means.

5. The exposure apparatus according to claim 2, further comprising:
   third light amount detecting means for detecting an amount of a second reflected light produced by irradiating said first laser light on the predetermined surface of said predetermined member; and
   averaging means for averaging successive periodic output signals from said third light amount detecting means,
   wherein said measuring means measures the thickness of said resist layer based on an output of said averaging means.

6. The exposure apparatus according to claim 1, wherein said light converging means includes means for converging said first laser light on said resist layer and and for converging said second laser light to the predetermined surface of said predetermined member.

7. An exposure apparatus for irradiating first laser light modulated in accordance with signals to be recorded on a resist layer formed by coating a photoresist on a predetermined surface of a predetermined member to form desired exposure patterns on said resist layer, said apparatus comprising:
   a light source for emitting second laser light having a wavelength that is not sensed by said resist layer;
   an optical system for directing said second laser light emitted from said light source to said resist layer:
   light converging means for converging said second laser light to a predetermined surface of said predetermined member;
   a focusing detection system for detecting an error in relative distance between said predetermined member and said light converging means based on a reflected light produced by irradiating said second laser light on the predetermined surface of said predetermined member;
   driving means for controlling movements of said light converging means based on an output of said focusing detection system to maintain a constant relative distance between said predetermined member and said light converging means;
   a light amount control means for controlling an output amount of said second laser light emitted from said light source to maintain a constant amount of said reflected light;
   light amount detecting means for detecting an amount of said reflected light; and
   measuring means for detecting defects on the predetermined surface of said predetermined member based on an output of said light amount detecting means.

8. The exposure apparatus according to claim 7, further comprising:

second light amount detecting means for detecting an amount of a second reflected light produced by irradiating said first laser light on the predetermined surface of said predetermined member; and demodulating means for demodulating an output signal from said second light amount detecting means, wherein said measuring means detects defects on the predetermined surface of said predetermined member based on an output of said demodulating means.

9. The exposure apparatus according to claim 7, further comprising:

second light amount detecting means for detecting an amount of a second reflected light produced by irradiating said first laser light on the predetermined surface of said predetermined member; and peak-holding detecting means for detecting and holding a peak of an output signal from said second light amount detecting means, wherein said measuring means detects defects on the predetermined surface of said predetermined member based on an output of said peak-holding detecting means.

10. The exposure apparatus according to claim 7, further comprising:

second light amount detecting means for detecting an amount of a second reflected light produced by irradiating said first laser light on the predetermined surface of said predetermined member; and averaging means for averaging successive periodic output signals from said second light amount detecting means, wherein said measuring means detects defects on the predetermined surface of said predetermined member based on an output of said averaging means.

11. The exposure apparatus according to claim 7, wherein said light converging means includes means for converging said first laser light on said resist layer and means for converging said second laser light to the predetermined surface of said predetermined member.

* * * * *